(12) United States Patent
Hu

(10) Patent No.: US 9,502,321 B2
(45) Date of Patent: Nov. 22, 2016

(54) THIN FILM RDL FOR IC PACKAGE

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 19 days.

(21) Appl. No.: 14/598,341

(22) Filed: Jan. 16, 2015

(65) Prior Publication Data
US 2016/0118311 A1    Apr. 28, 2016

Related U.S. Application Data

(63) Continuation-in-part of application No. 14/522,760, filed on Oct. 24, 2014.

(51) Int. Cl.
| | | |
|---|---|---|
| *H01L 23/495* | (2006.01) | |
| *H01L 23/13* | (2006.01) | |
| *H01L 23/31* | (2006.01) | |
| *H01L 23/00* | (2006.01) | |
| *H01L 21/48* | (2006.01) | |
| *H01L 21/56* | (2006.01) | |

(52) U.S. Cl.
CPC ........... *H01L 23/13* (2013.01); *H01L 21/4846* (2013.01); *H01L 23/3157* (2013.01); *H01L 24/11* (2013.01); *H01L 24/17* (2013.01); *H01L 24/83* (2013.01); *H01L 24/97* (2013.01); *H01L 21/563* (2013.01); *H01L 2224/16168* (2013.01); *H01L 2224/16227* (2013.01); *H01L 2224/32225* (2013.01); *H01L 2224/73204* (2013.01); *H01L 2224/81005* (2013.01); *H01L 2224/92125* (2013.01); *H01L 2224/97* (2013.01); *H01L 2924/15311* (2013.01)

(58) Field of Classification Search
CPC .................. H01L 23/49822; H01L 23/49816; H01L 23/13; H01L 23/3157; H01L 21/4846; H01L 24/83
See application file for complete search history.

(56) References Cited

U.S. PATENT DOCUMENTS

| | | | |
|---|---|---|---|
| 2006/0163740 A1* | 7/2006 | Ohno | H01L 23/49816 257/762 |
| 2008/0117608 A1* | 5/2008 | Seo | H01L 24/18 361/761 |
| 2009/0087951 A1* | 4/2009 | Jeon | H01L 21/6835 438/118 |
| 2009/0277673 A1* | 11/2009 | Sohn | H01L 23/5389 174/258 |
| 2011/0024167 A1* | 2/2011 | Hashimoto | H05K 3/4688 174/258 |
| 2011/0317382 A1* | 12/2011 | Cho | H01B 3/40 361/762 |
| 2012/0273960 A1* | 11/2012 | Park | H01L 21/4846 257/774 |
| 2013/0037943 A1* | 2/2013 | Yamano | H01L 25/50 257/737 |
| 2013/0242493 A1* | 9/2013 | Shenoy | H01L 23/49827 361/679.21 |
| 2014/0021583 A1* | 1/2014 | Lo | H01L 23/49816 257/532 |
| 2014/0102777 A1 | 4/2014 | Chen et al. | |

* cited by examiner

*Primary Examiner* — Ahmed Sefer
(74) *Attorney, Agent, or Firm* — Hauptman Ham, LLP

(57) ABSTRACT

A package substrate comprising a thin film redistribution layer (RDL) with a plurality of metal pillar configured on chip side is disclosed to thin the thickness of an IC package before mounting to a circuit board. The height of metal pillar keeps a proper distance between the IC chip and the package substrate so that an underfill material can be filled in between to ensure the reliability of the IC package.

17 Claims, 31 Drawing Sheets

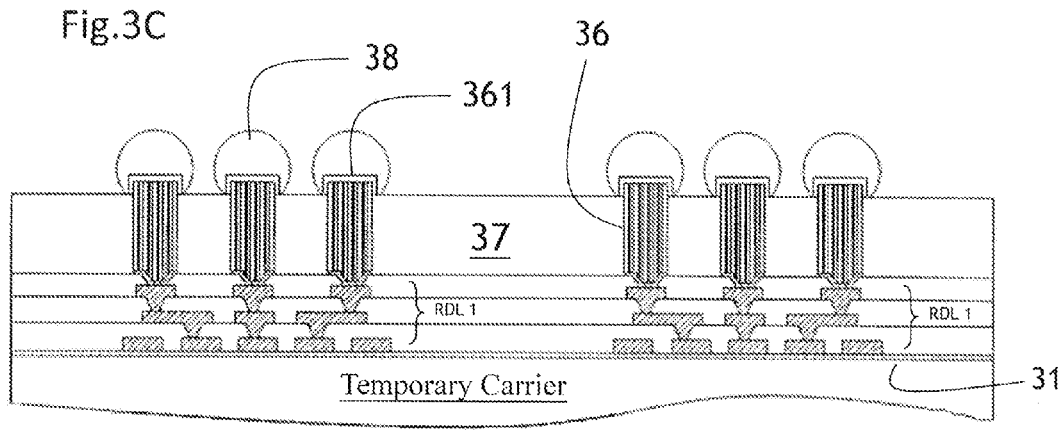

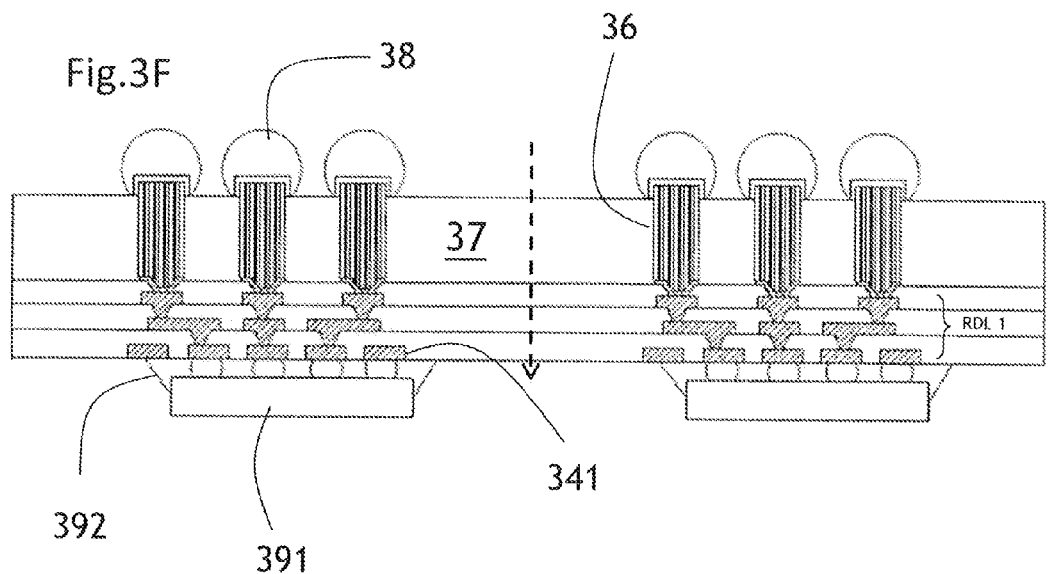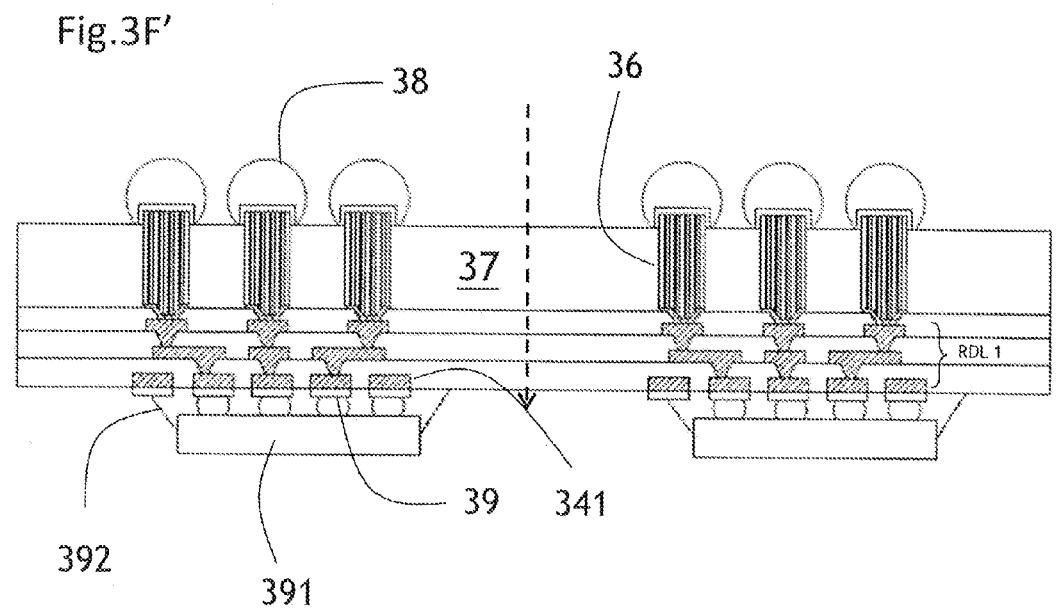

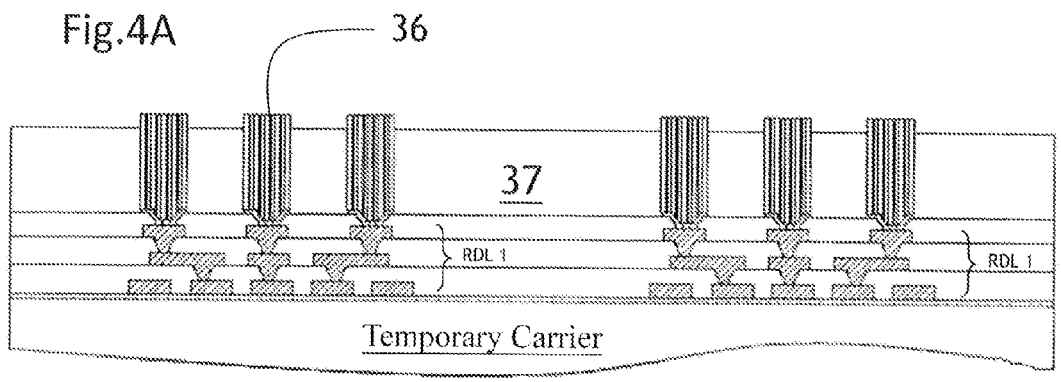
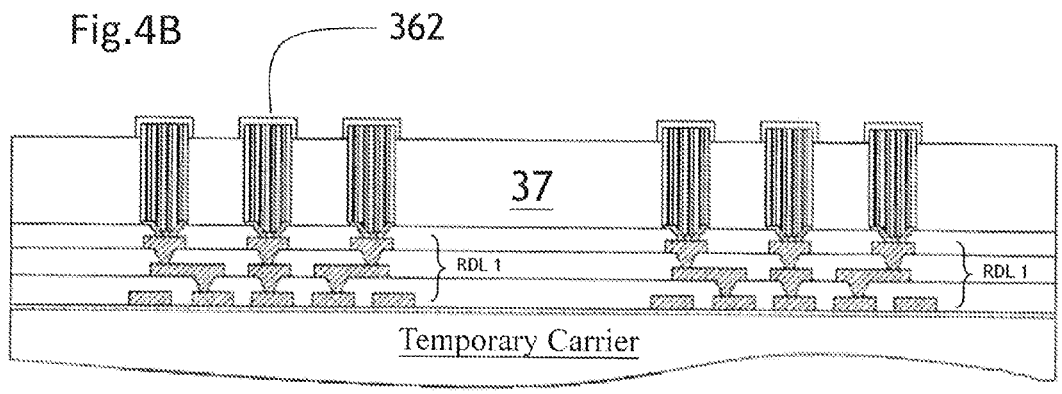

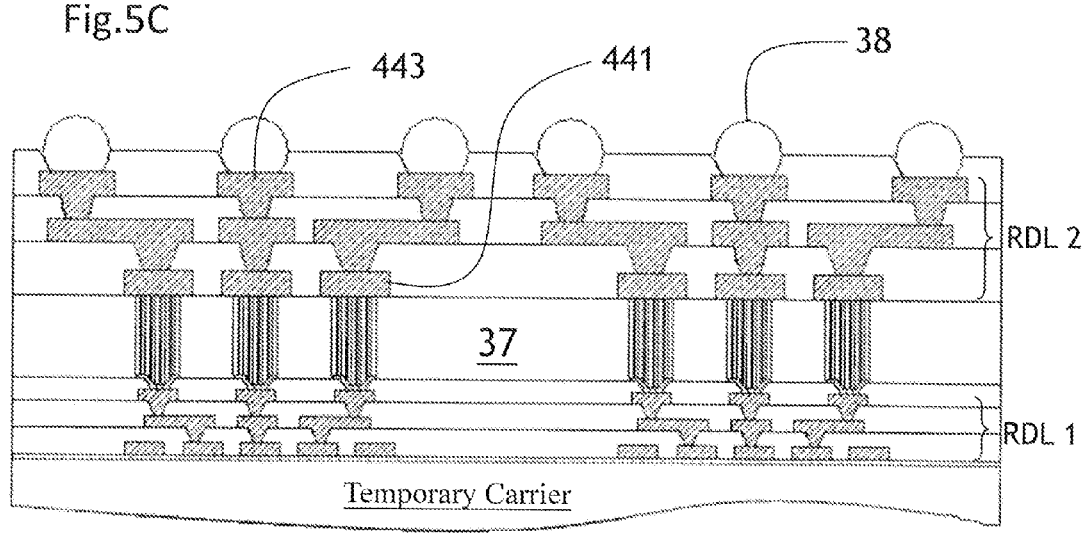

RDL 2

341

39  341

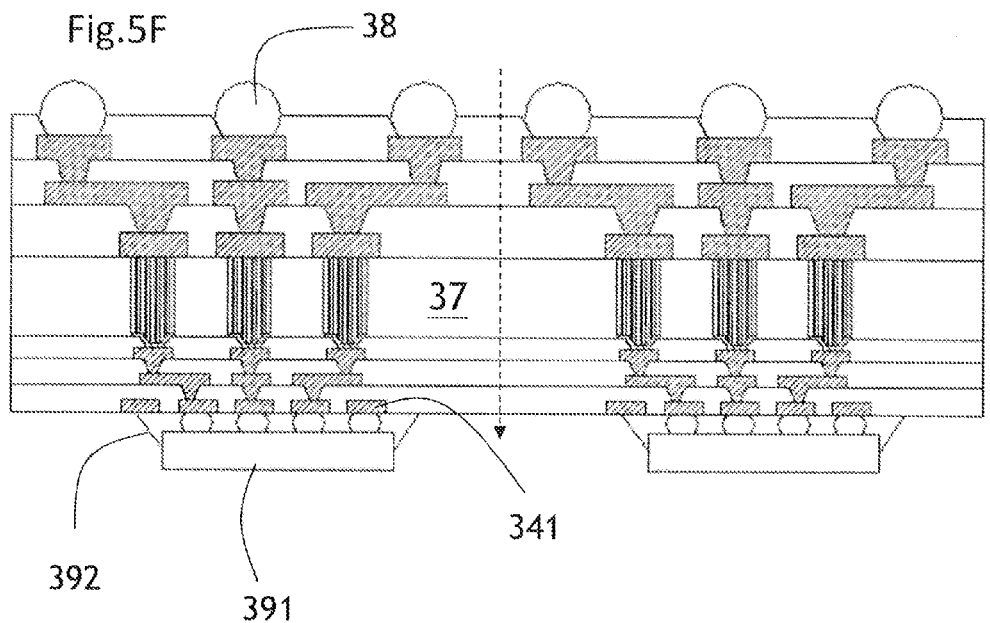
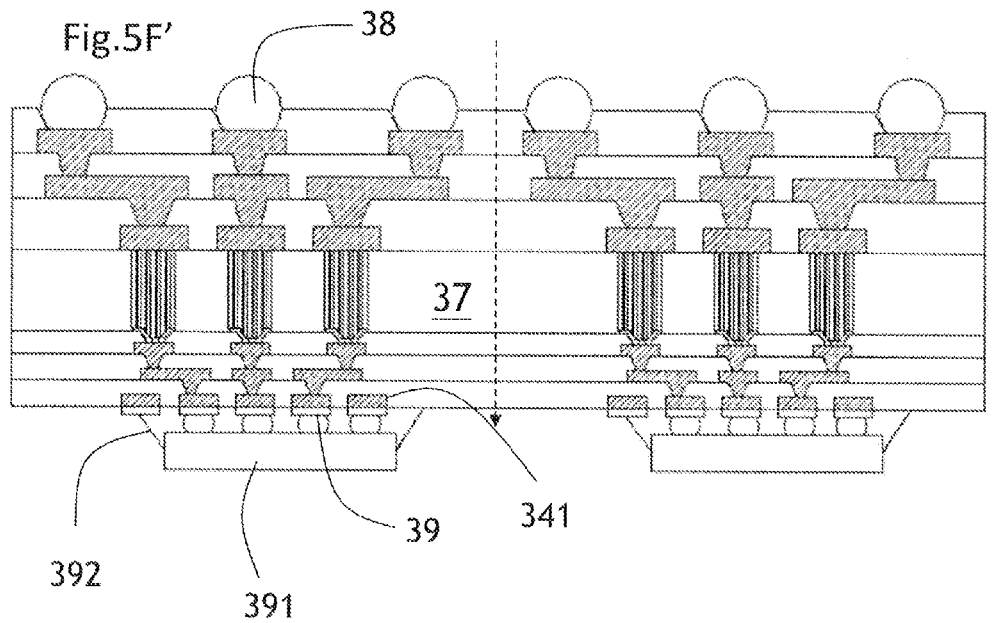

THIN FILM RDL FOR IC PACKAGE

This application is a continuation-in-part application of U.S. application Ser. No. 14/522,760 filed Oct. 24, 2014, the disclosure of which is incorporated by reference herein in its entirety.

BACKGROUND

Technical Field

The present invention relates to a package substrate for IC package, the package substrate comprises a redistribution layer (RDL) with a plurality of metal pillar configured on high density side, i.e. chip side, for connecting to an IC chip. The height of the metal pillar defines a space between the IC chip and the package substrate. An underfill shall be filled in the space to ensure package reliability.

Description of Related Art

FIG. 1A shows a prior art substrate for IC package

FIG. 1A shows a prior art substrate for IC package disclosed in US2014/0102777A1 which has an embedded silicon interposer 20. The silicon interposer 20 has four lateral sides 206. A molding compound 22 wraps the silicon interposer 20 around the four lateral sides 206. A plurality of via metal 200 is made through the silicon interposer 20. An insulation liner 201 is made between the through via 200 and the silicon interposer 20 for an electrical insulation therebetween. A top redistribution layer 21 is made on top of the silicon interposer 20 with a plurality of metal pad 210 exposed on top. The plurality of metal pad 210 on top is provided for accommodating an IC chip (not shown) to mount. A circuit built-up layer 25 is made on bottom of the silicon interposer 20 with a plurality of metal pad 220 configured on bottom. A plurality of solder ball 24 is configured and each solder ball 24 is configured on bottom of a corresponding bottom metal pad 220.

FIG. 1B shows a reversed view of FIG. 1A. FIG. 1B is made to present the prior art of FIG. 1A in a position similar to a package substrate of the present invention to facilitate a comparison there between. FIG. 1B shows an up-down view of FIG. 1A. The top solder ball 24 is configured for mounting the package substrate onto a mother board (not shown). The bottom metal pad 210 is configured for a chip or chips to mount.

BRIEF DESCRIPTION OF THE DRAWINGS

FIGS. 2A~2L and 3A~3C, shows a manufacturing process according to the present invention.

FIG. 3F shows an IC chip mounted on bottom of FIG. 3D
FIG. 3F shows an IC chip mounted on bottom of FIG. 3E
FIG. 3G' shows an IC package unit obtained through singulating the product of FIG. 3F
'
FIGS. 2A~2L and 4A~4C, shows a manufacturing process according to the present invention.
'
FIGS. 2A~2L and 5A~5C, shows a manufacturing process according to the present invention.
FIG. 5F shows an IC chip mounted on bottom of FIG. 5D
FIG. 5F' shows an IC chip mounted on bottom of FIG. 5E

DETAILED DESCRIPTION OF THE INVENTION

FIGS. 2A~2L and 3A~3C, Shows a Manufacturing Process According to the Present Invention.

Figure 3A:
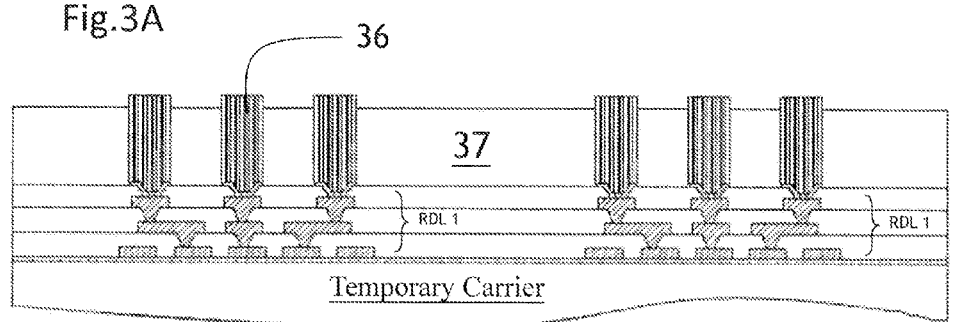
Figure 3B:
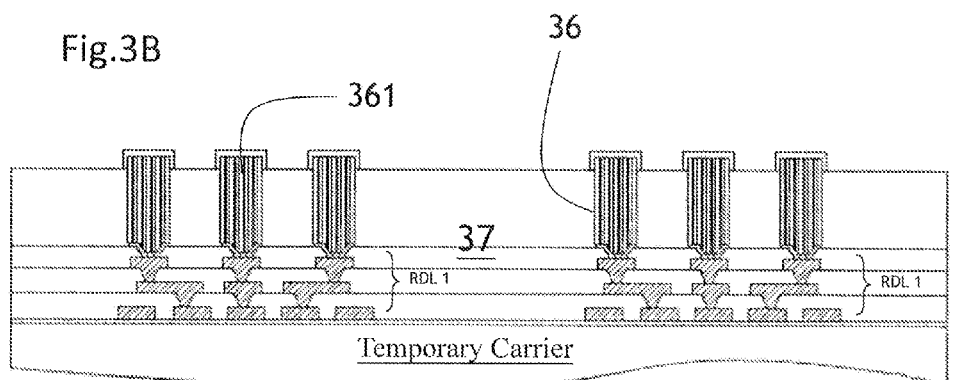
Figure 3D:
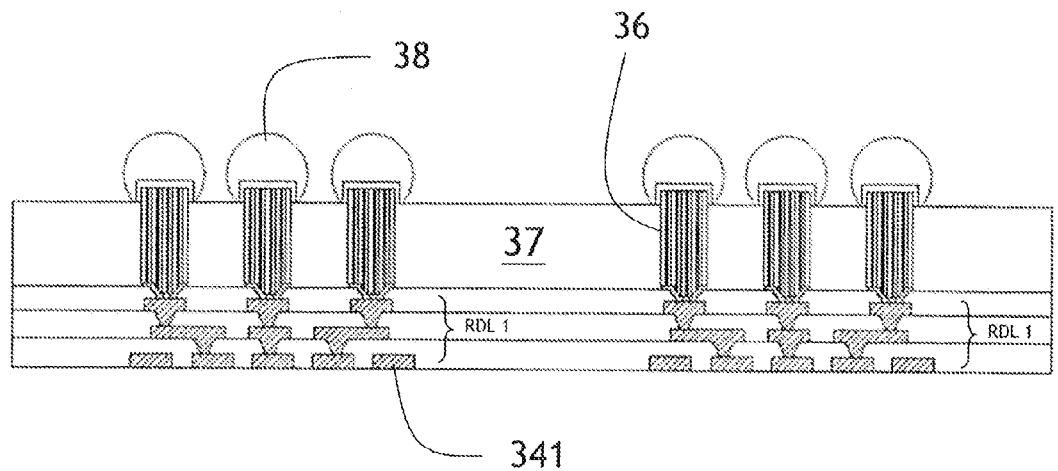
FIG. 3D is a first embodiment of the present invention.
Figure 3E:
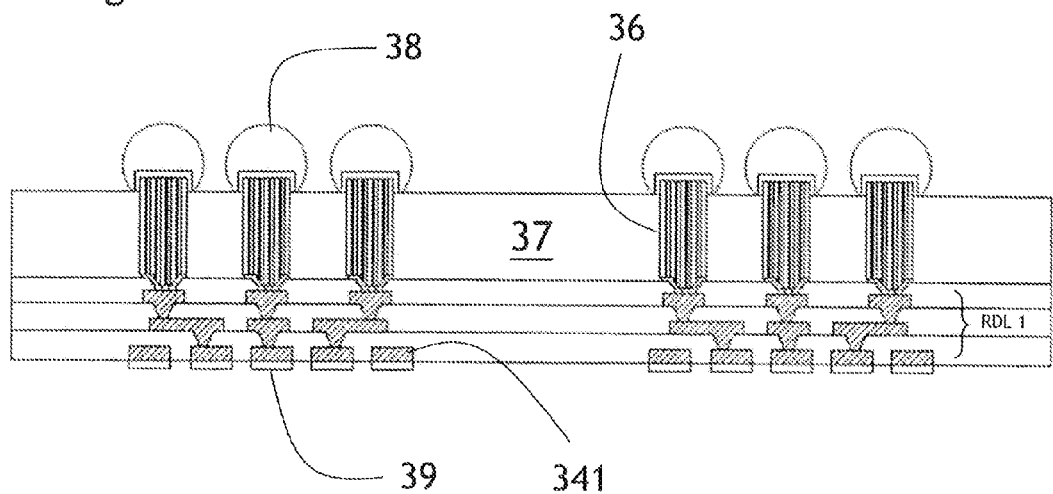
FIG. 3E is a second embodiment of the present invention.

FIG. 3D is a First Embodiment of the Present Invention.
FIG. 3E is a Second Embodiment of the Present Invention.

Figure 1A:
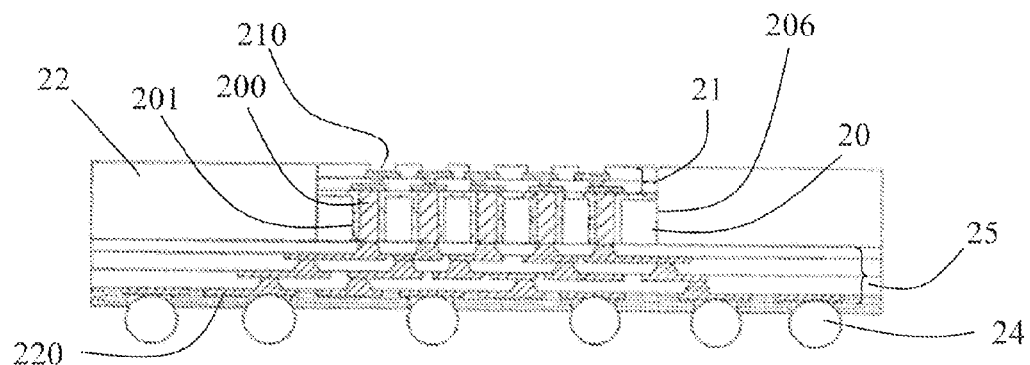
FIG. 1A~1B show a prior art substrate for IC package
Figure 1B:
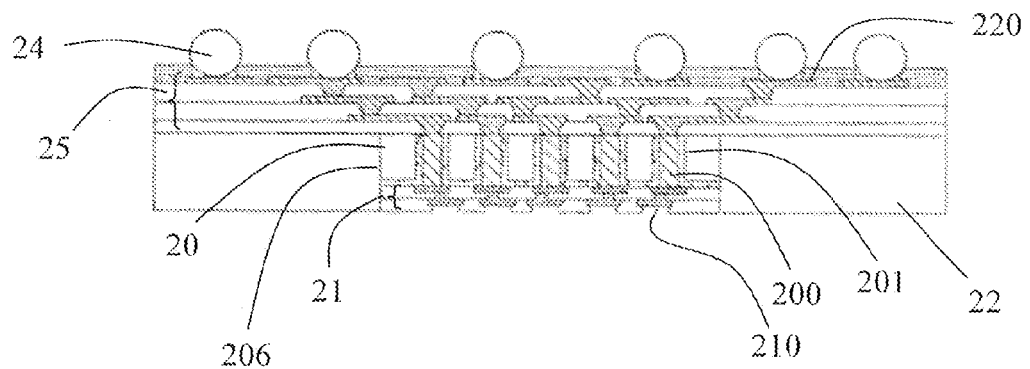
Figure 2A:
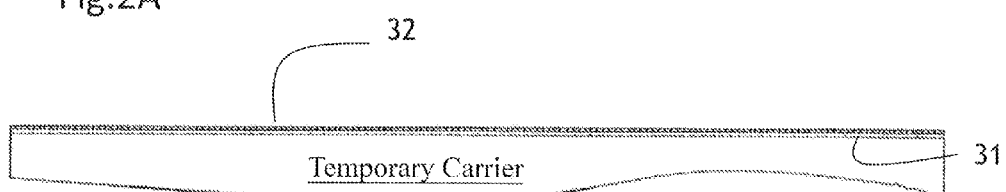

A molding compound supported RDL for IC package is fabricated, includes the following steps:

FIG. 2A shows: preparing a temporary carrier; applying a release layer 31 on top of the temporary carrier; and applying a bottom seed layer 32 on top of the release layer 31.

Figure 2B:
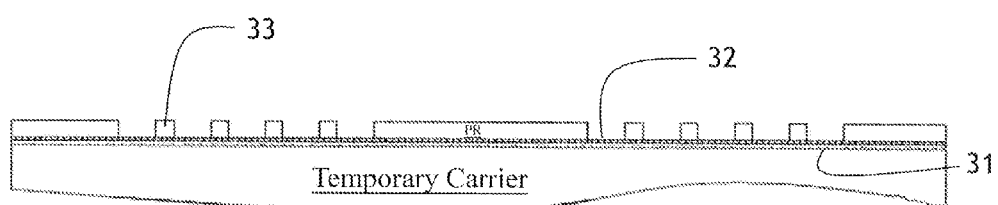

FIG. 2B shows: applying a patterned photoresist 33 on top of the bottom seed layer 32.

Figure 2C:
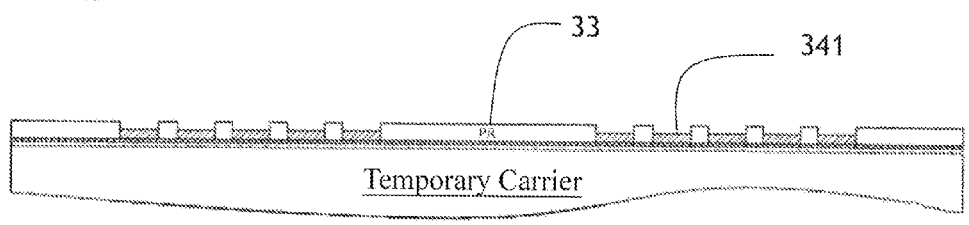

FIG. 2C shows: forming a patterned first bottom metal pad 341.

Figure 2D:
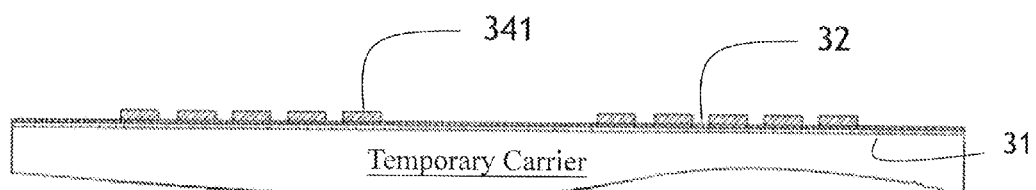

FIG. 2D shows: stripping the photo-resist 33.

Figure 2E:
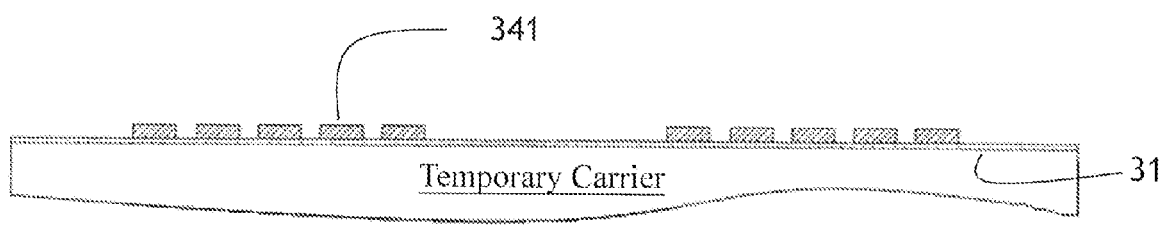

FIG. 2E shows: stripping the bottom seed layer 32 between the first bottom metal pads 341.

Figure 2F:
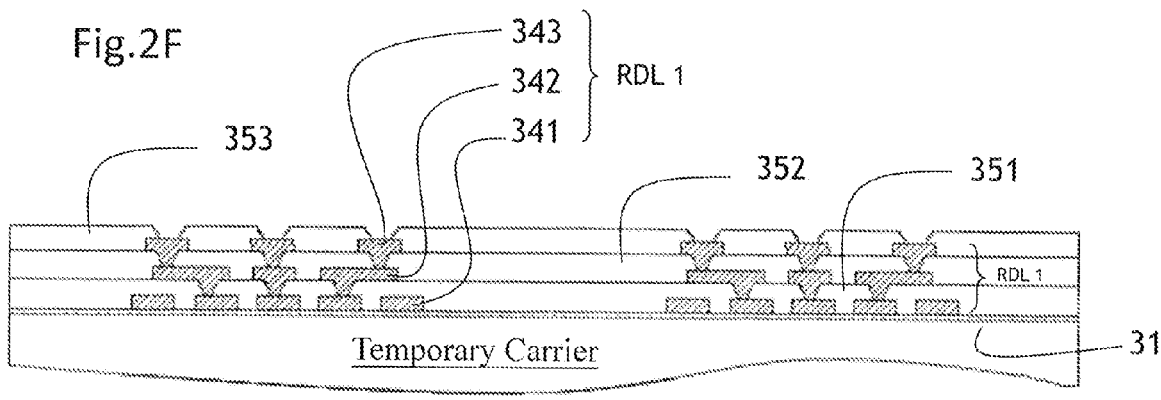
Figure 2G:
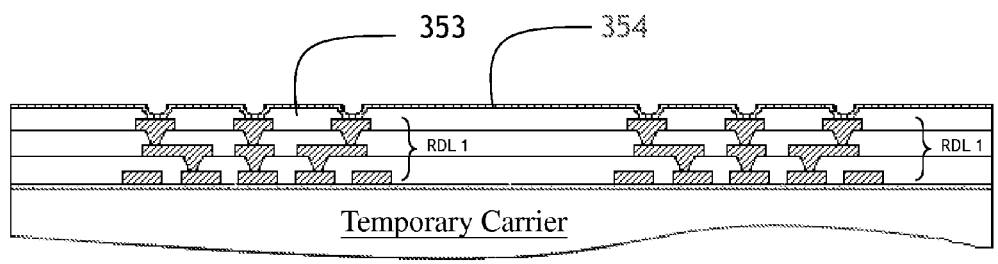
Figure 2H:
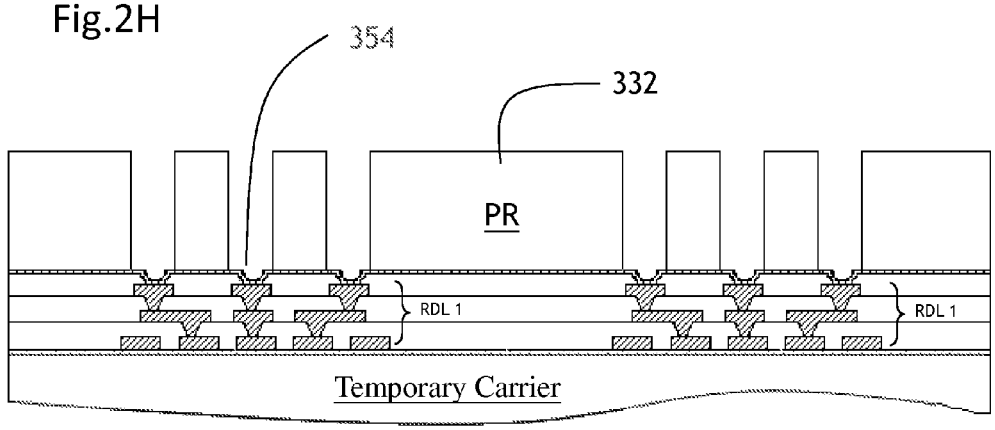
Figure 2I:
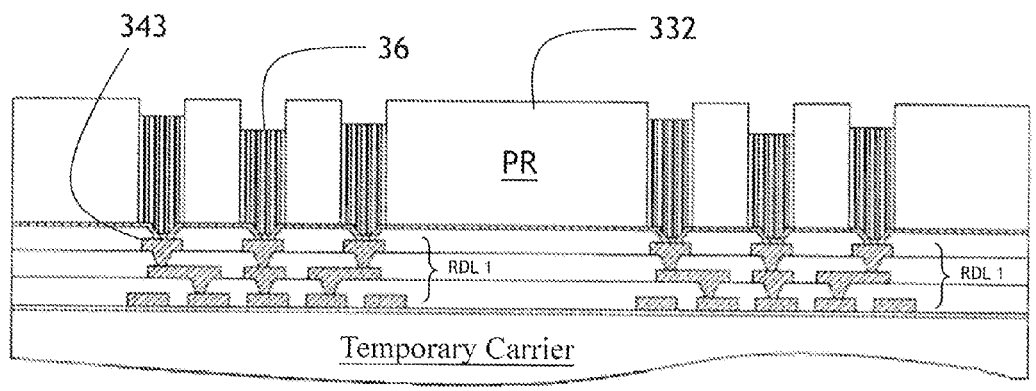
Figure 2J:
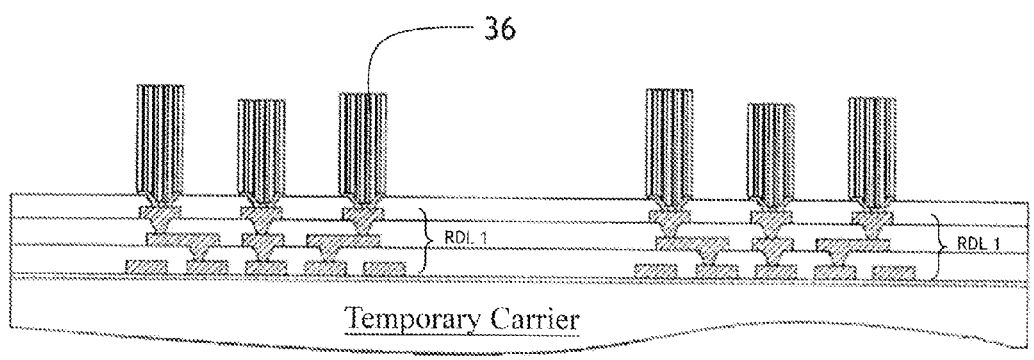
Figure 2K:
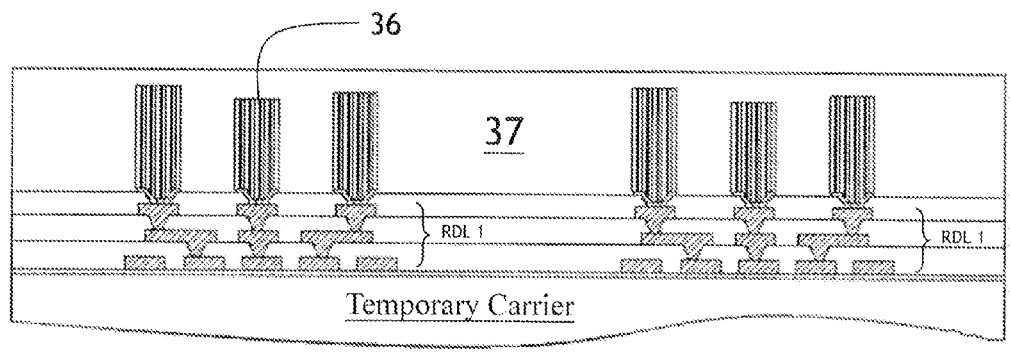
Figure 2L:
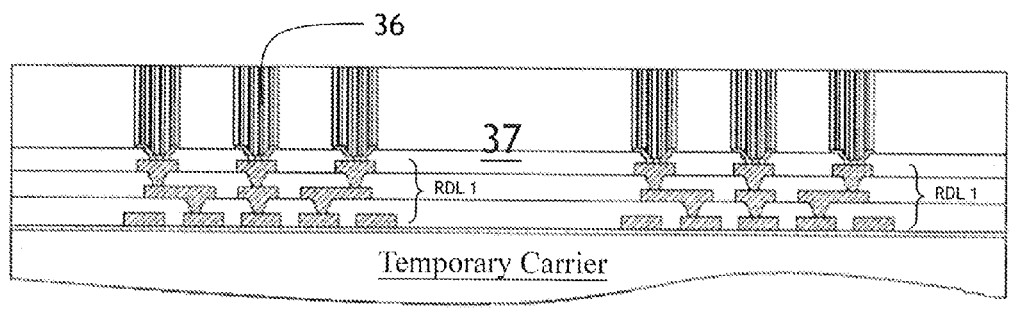

FIG. 2F shows: forming a bottom RDL (RDL 1) using the first bottom metal pad 341 as a starting point; forming a plurality of first top metal pad 343 on top of the bottom RDL (RDL 1), wherein at least one circuit layer 342 is made between the first bottom metal pad 341 and the first top metal pad 343. A first top dielectric layer 353 is formed on top of the first top metal pad 343 and a plurality opening is made to expose a top of each first top metal pad 343. The first bottom metal pad 341, circuit layer 342, and the first top metal pad 343 are embedded in the dielectric layers 351, 352, 353; forming a first top dielectric layer with a plurality of opening, each opening exposes a top of a corresponding first top metal pad;

FIG. 2G shows: applying a seed layer 354 on top of the first top dielectric layer 353 and the first top metal pad;

FIG. 2H shows: forming a patterned photoresist 332 on top of the seed layer 352;

FIG. 2I shows: forming a plurality of metal pillar 36, each is formed on top of a corresponding first top metal pad 343;

FIG. 2J show: stripping the photoresist 332 and leaving the metal pillar 36 exposed;

stripping the top seed layer 322 between metal pillars 36;
revealing the plurality of metal pillar;

FIG. 2K shows: applying a molding compound 37 to encapsulate the plurality of metal pillar 36;

FIG. 2L shows: thinning from top of the molding compound 37; and
revealing a top surface of each metal pillar 36.

FIG. 3A shows: removing portion of the molding compound 37 from top;
revealing a top end of each metal pillar 36;

FIG. 3B shows: forming a protection layer 361, such as an Electroless Nickel/Electroless Palladium/Immersion Gold (ENEPIG), on each revealed top of the metal pillar 36;

FIG. 3C shows: planting a plurality of solder ball 38, each is planted on top of a corresponding ENEPIG 361 which brackets a top end of a corresponding metal pillar 36;

FIG. 3D shows: removing the temporary carrier; and removing the bottom seed layer 32 from bottom of each first bottom metal pad 341. FIG. 3D shows a molding compound 37 wrapping a plurality of metal pillar 36, a protection layer 361 is configured on top of a corresponding metal pillar 36; a solder ball is configured on top of each protection layer 361; a bottom RDL (RDL 1) is made on bottom of the molding compound 37.

FIG. 3E shows: forming a bottom protection layer 39 on bottom of a corresponding first bottom metal pad 341. The protection layer is ENEPIG. The protection layer prevents oxidation of the exposed end of the metal pillar 36 before next step. FIG. 3E shows a molding compound 37 wrapping a plurality of metal pillar 36, a protection layer 361 is configured on top of a corresponding metal pillar 36; a solder ball is configured on top of each protection layer 361; a bottom RDL (RDL 1) is made on bottom of the molding compound 37; a bottom protection layer 39 is made on bottom of a corresponding first bottom metal pad 341.

FIG. 3F Shows an IC Chip Mounted on Bottom of FIG. 3D

FIG. 3F shows a chip 391 mounted on bottom of FIG. 3D; the chip 391 is electrically coupled to the first bottom metal pad 341 through a plurality of solder ball. An under fill 392 can be made between the chip 391 and the first bottom metal pad 341.

FIG. 3F' Shows an IC Chip Mounted on Bottom of FIG. 3E

FIG. 3F' shows a chip 391 mounted on bottom of FIG. 3E; the chip 391 is electrically coupled to the bottom protection layer 39 through a plurality of solder ball. An under fill 392 can be made between the chip 391 and the bottom protection layer 39.

Figure 3G:
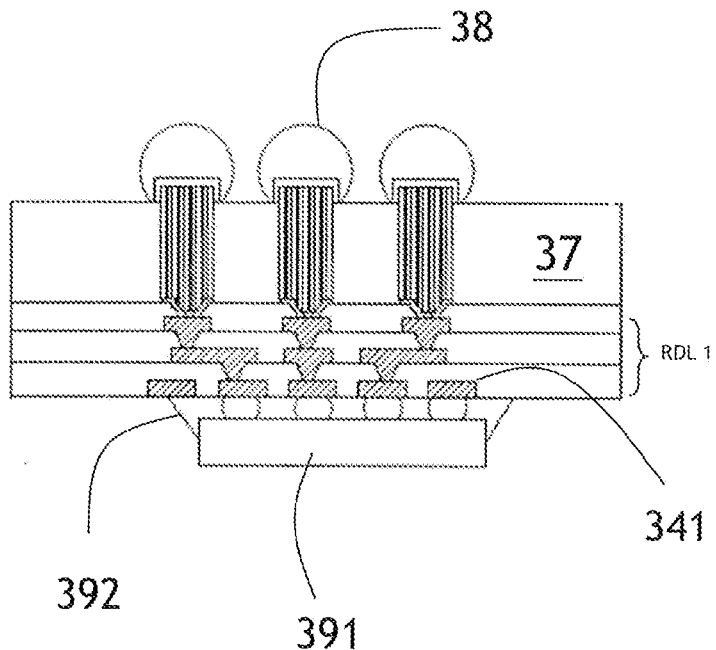
FIG. 3G shows an IC package unit obtained through singulating the product of FIG. 3E.
Figure 3G:
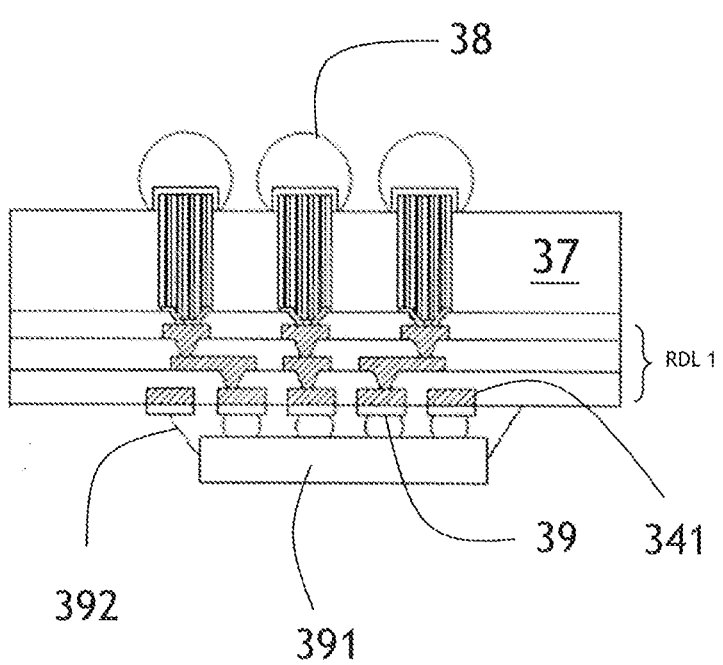

FIG. 3G Shows an IC Package Unit Obtained Through Singulating the Product of FIG. 3F.

FIG. 3G shows an IC package which is a package based on the molding compound supported RDL of the first embodiment according to the present invention.

FIG. 3G' Shows an IC Package Unit Obtained Through Singulating the Product of FIG. 3F'

FIG. 3G' shows an IC package which is a package based on the molding compound supported RDL of the second embodiment according to the present invention.

FIGS. 2A~2L and 4A~4C, Shows a Manufacturing Process According to the Present Invention.

Figure 4C:
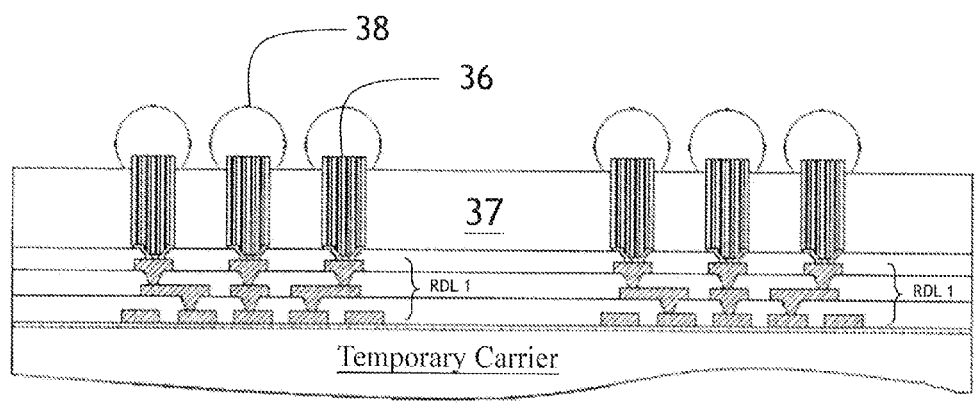
Figure 4D:
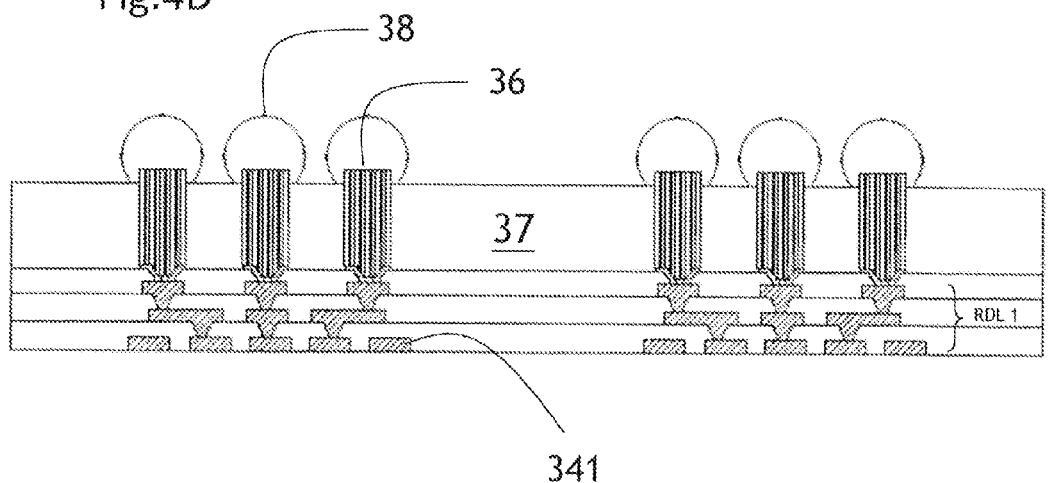
FIG. 4D is a third embodiment of the present invention.

FIG. 4D is a Third Embodiment of the Present Invention.

Figure 4E:
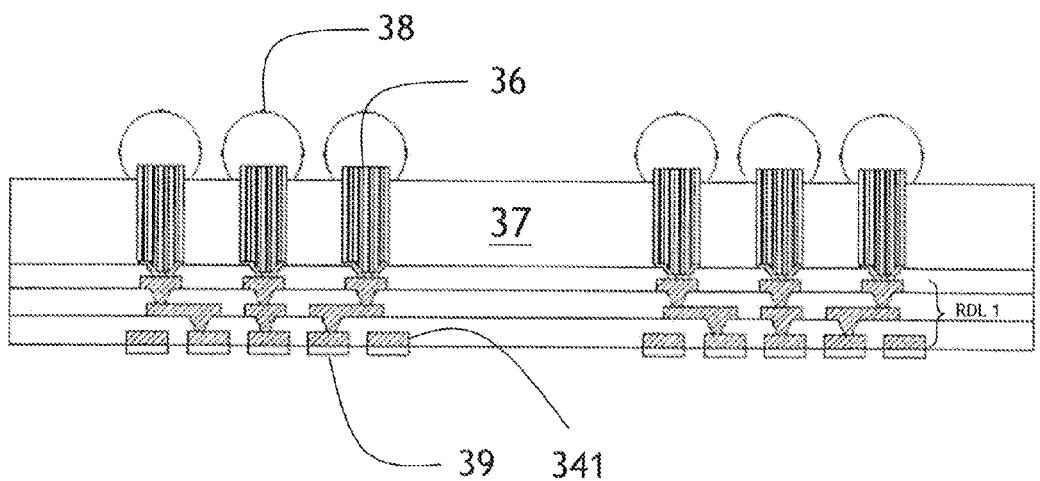
FIG. 4E is a fourth embodiment of the present invention.

FIG. 4E is a Fourth Embodiment of the Present Invention.

The manufacturing process of FIGS. 2A~2L is the same as described in previous paragraph and omitted here for simplification.

FIG. 4A shows: removing portion of the molding compound 37 from top;

revealing a top end of each metal pillar 36;

FIG. 4B shows: forming a protection layer 362, such as an Organic Solderability Preservatives (OSP), on each revealed top of the metal pillar 36. The protection layer prevents oxidation of the exposed end of the metal pillar 36 before next step.

FIG. 4C shows: planting a plurality of solder ball 38, each is planted on top of a corresponding protection layer 362, however OSP is cleaned out by soldering flux and heat; therefore, the solder ball 38 can be seen planted directly on a top of a corresponding metal pillar 36.

FIG. 4D shows: removing the temporary carrier; and removing the seed layer 32 from bottom of each first bottom metal pad 341.

FIG. 4E shows: forming a bottom protection layer 39 on bottom of a corresponding first bottom metal pad 341. The protection layer is ENEPIG. FIG. 4E shows a molding compound 37 wrapping a plurality of metal pillar 36; a solder ball is configured on top of a corresponding metal pillar 36; a bottom RDL (RDL 1) is made on bottom of the molding compound 37; a bottom protection layer 39 is made on bottom of a corresponding first bottom metal pad 341.

Figure 4F:
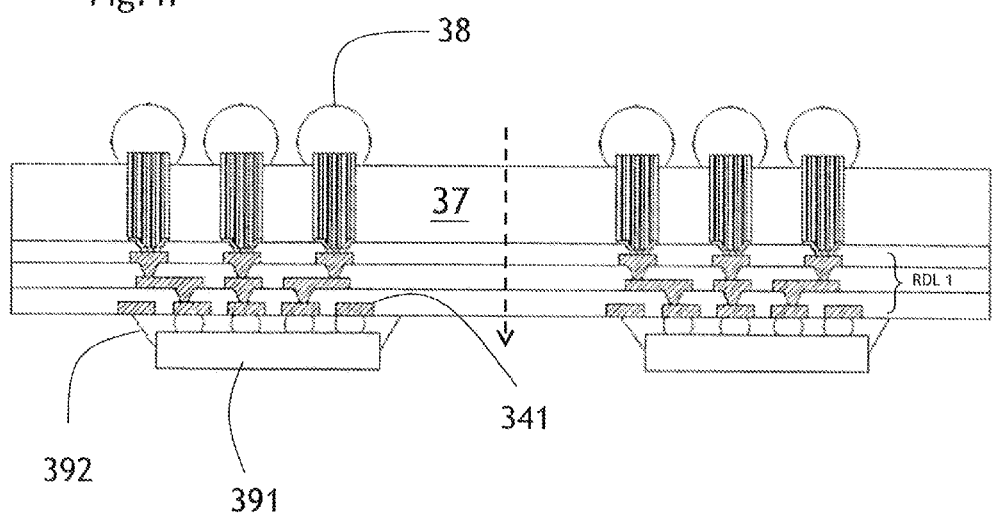
FIG. 4F shows an IC chip mounted on bottom of FIG. 4D
FIG. 4F' shows an IC chip mounted on bottom of FIG. 4E
Figure 4F:
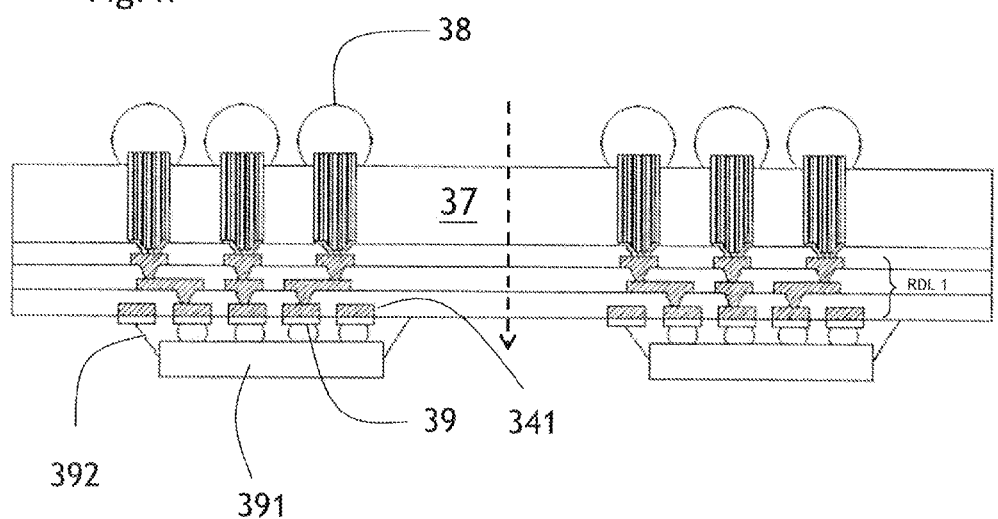

FIG. 4F Shows an IC Chip Mounted on Bottom of FIG. 4D

FIG. 4F shows an IC chip mounted on bottom of FIG. 4D; the chip 391 is electrically coupled to the first bottom metal pad 341 through a plurality of solder ball. An under fill 392 can be made between the chip 391 and the first bottom metal pad 341.

FIG. 4F' Shows an IC Chip Mounted on Bottom of FIG. 4E

FIG. 4F' shows an IC chip 391 mounted on bottom of FIG. 4E; the chip 391 is electrically coupled to the bottom protection layer 39 through a plurality of solder ball. An under fill 392 can be made between the chip 391 and the bottom protection layer 39.

Figure 4G:
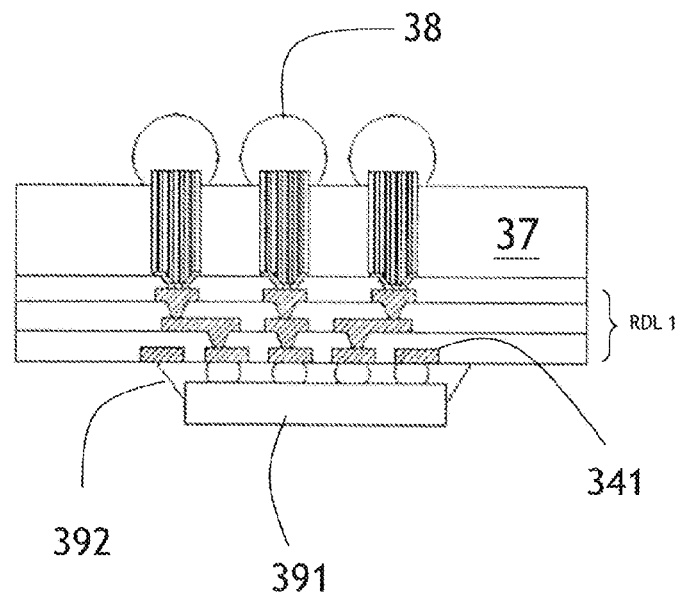
FIG. 4G shows an IC package unit obtained through singulating the product of FIG. 4F.
Figure 4G:
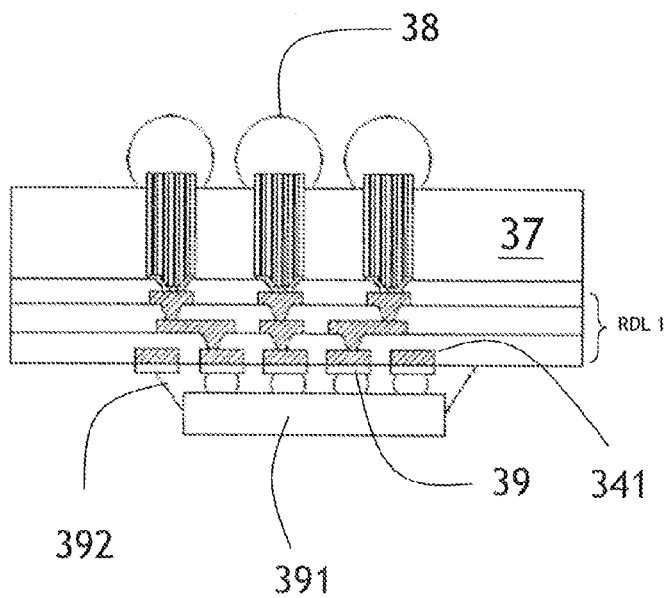

FIG. 4G Shows an IC Package Unit Obtained Through Singulating the Product of FIG. 4F.

FIG. 4G shows an IC package which is a package based on the molding compound supported RDL of the third embodiment according to the present invention.

FIG. 4G' Shows an IC Package Unit Obtained Through Singulating the Product of FIG. 4F'

FIG. 4G' shows an IC package which is a package based on the molding compound supported RDL of the fourth embodiment according to the present invention.

FIGS. 2A~2L and 5A~5C, Shows a Manufacturing Process According to the Present Invention.

Figure 5A:
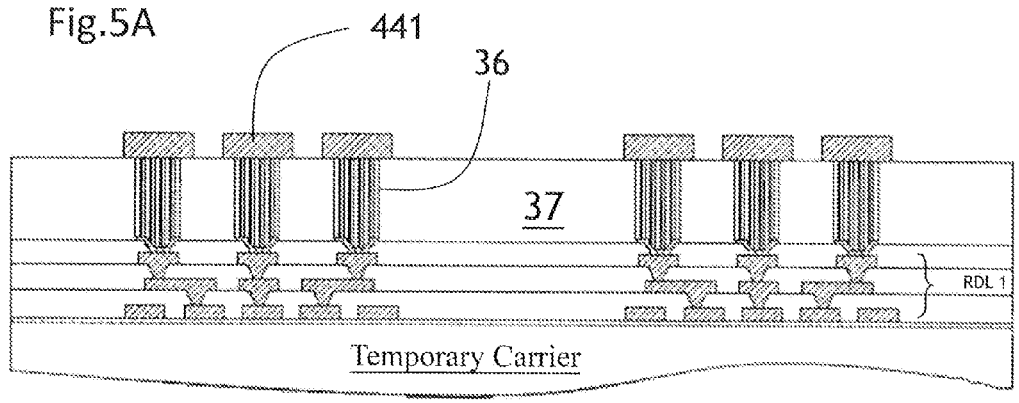
Figure 5B:
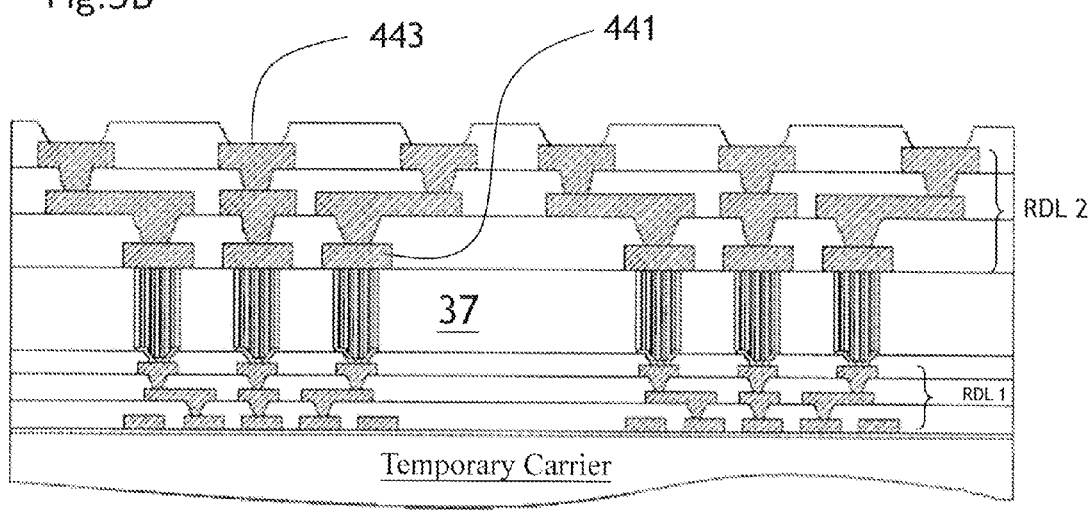
Figure 5D:
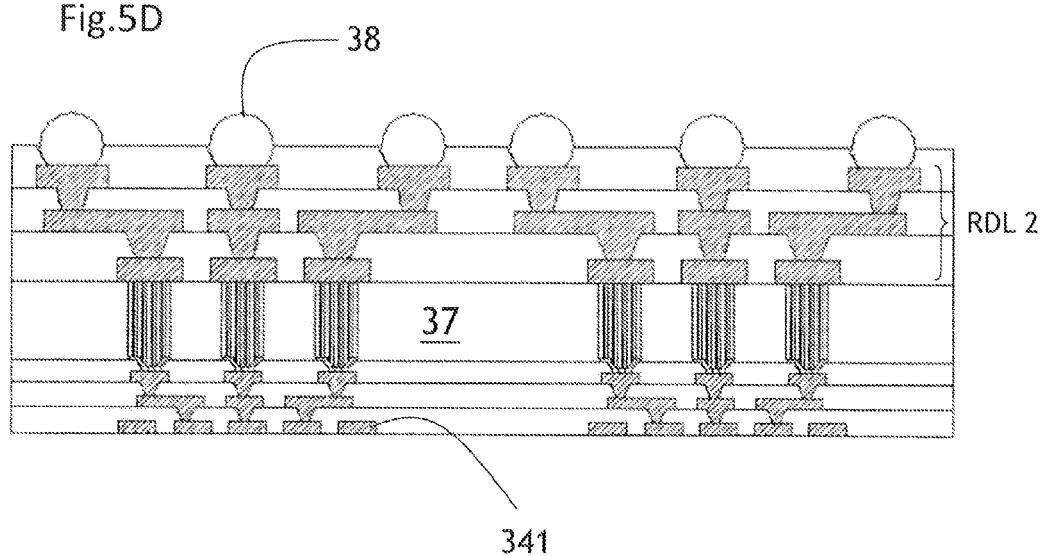
FIG. 5D is a fifth embodiment of the present invention.

FIG. 5D is a Fifth Embodiment of the Present Invention.

Figure 5E:
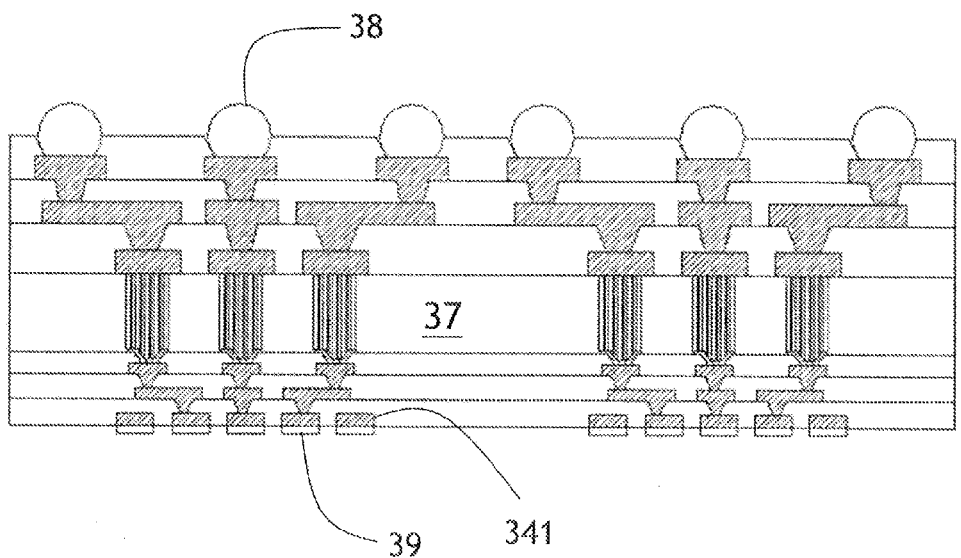
FIG. 5E is a sixth embodiment of the present invention.

FIG. 5E is a Sixth Embodiment of the Present Invention.

The manufacturing process of FIGS. 2A~2L is the same as described in previous paragraph and omitted here for simplification.

FIG. 5A shows: forming a second bottom metal pad 441 on top of a corresponding metal pillar 36;

FIG. 5B shows: forming a top RDL (RDL 2) on top of the molding compound 37; forming a plurality of second top metal pad 443 on top of the top RDL (RDL 2);

FIG. 5C shows: planting a plurality of solder ball 38, each is planted on top of a corresponding second top metal pad;

FIG. 5D shows: removing the temporary carrier; and removing the bottom seed layer 32 from bottom of each first bottom metal pad 341.

FIG. 5E shows: forming a bottom protection layer 39 on bottom of a corresponding first bottom metal pad 341.

FIG. 5F Shows an IC Chip Mounted on Bottom of FIG. 5D

FIG. 5F shows an IC chip mounted on bottom of FIG. 5D; the chip 391 is electrically coupled to the first bottom metal pad 341 through a plurality of solder ball. An under fill 392 can be made between the chip 391 and the first bottom metal pad 341.

FIG. 5F' Shows an IC Chip Mounted on Bottom of FIG. 5E

FIG. 5F' shows an IC chip 391 mounted on bottom of FIG. 5E; the chip 391 is electrically coupled to the bottom protection layer 39 through a plurality of solder ball. An under fill 392 can be made between the chip 391 and the bottom protection layer 39.

Figure 5G:
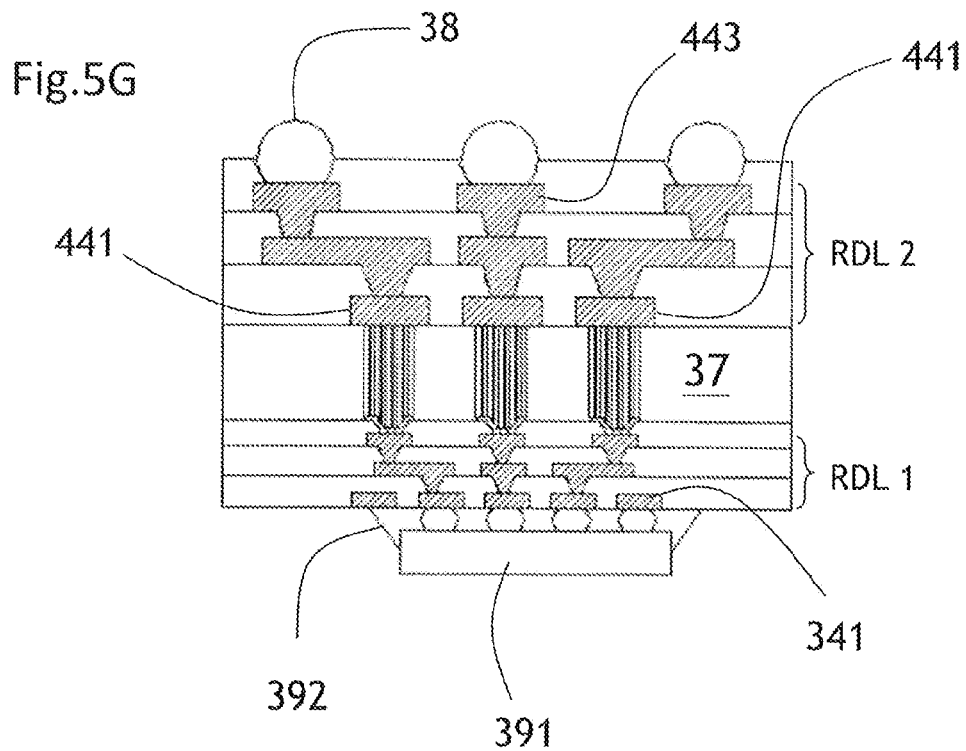
FIG. 5G shows an IC package unit obtained through singulating the product of FIG. 5F.
Figure 5G:
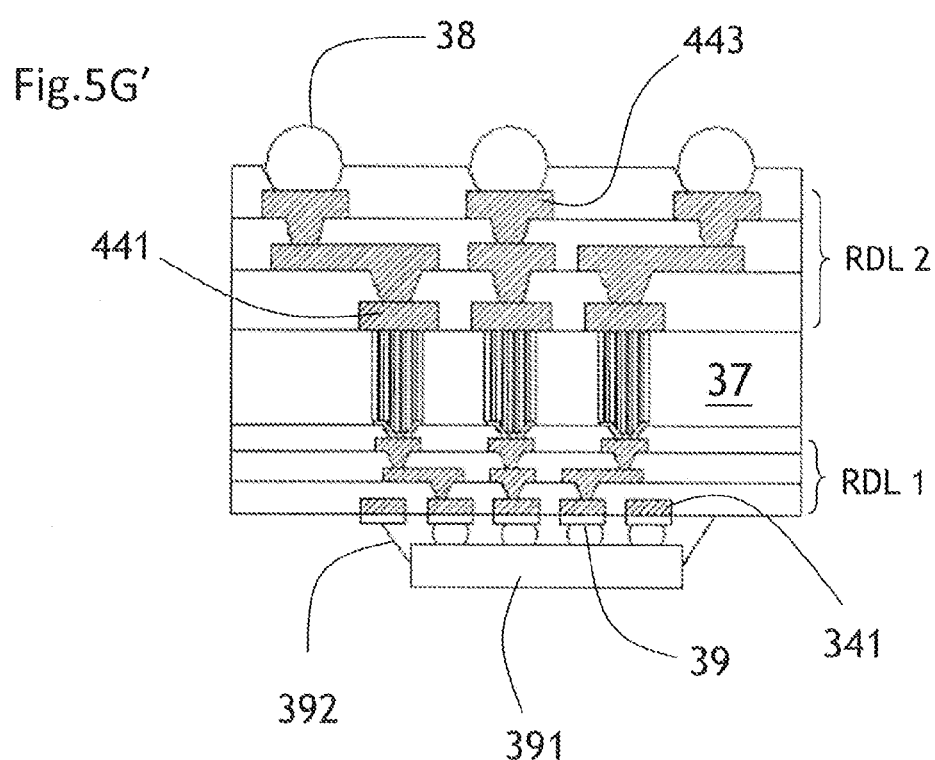

FIG. 5G Shows an IC Package Unit Obtained Through Singulating the Product of FIG. 5F.

FIG. 5G shows an IC package which is a package based on the molding compound supported RDL of the fifth embodiment according to the present invention.

FIG. 5G' shows an IC package unit obtained through singulating the product of FIG. 5F'

FIG. 5G' shows an IC package which is a package based on the molding compound supported RDL of the sixth embodiment according to the present invention.

Figure 6A:
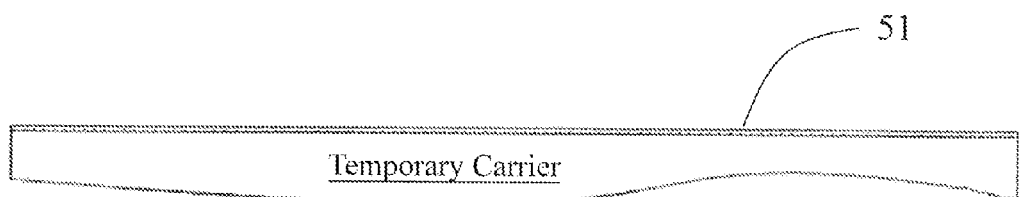
FIGS. 6A~6Q shows a seventh embodiment of the present invention.
Figure 6B:
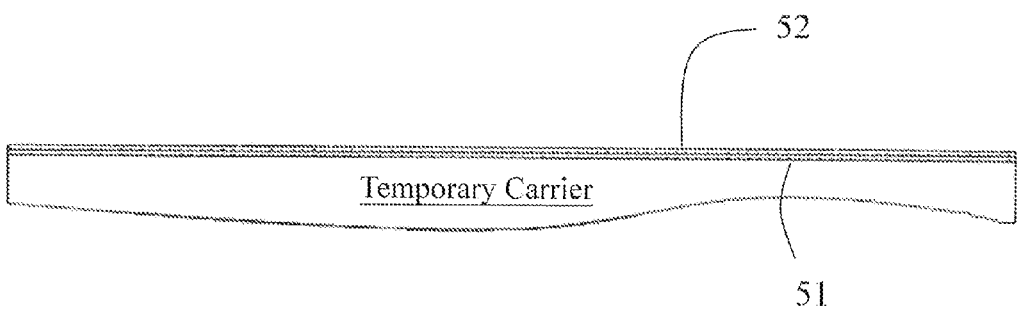
Figure 6C:
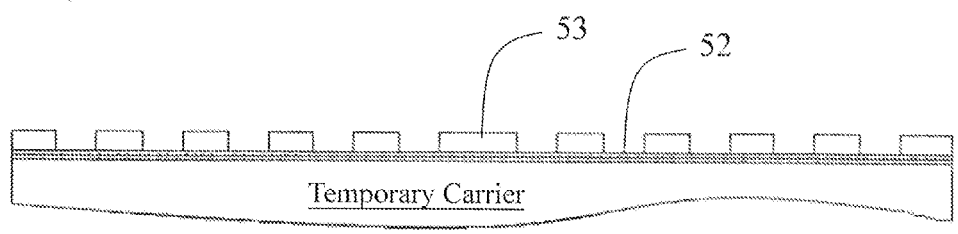
Figure 6D:
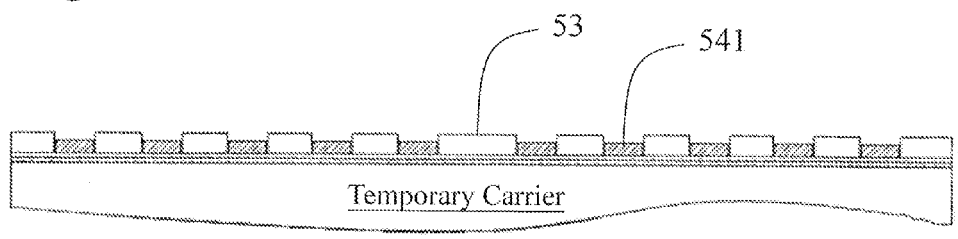
Figure 6E:
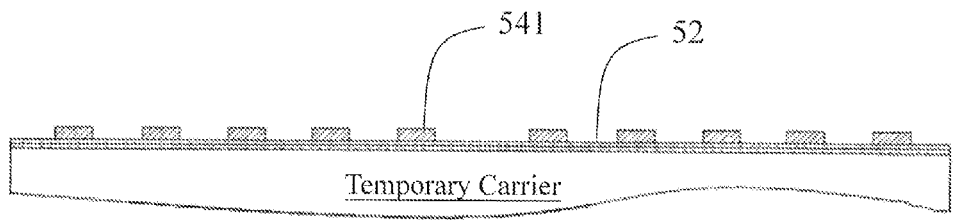
Figure 6F:
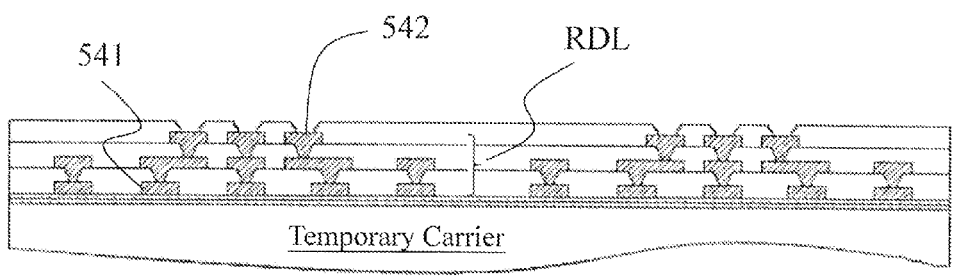
Figure 6G:
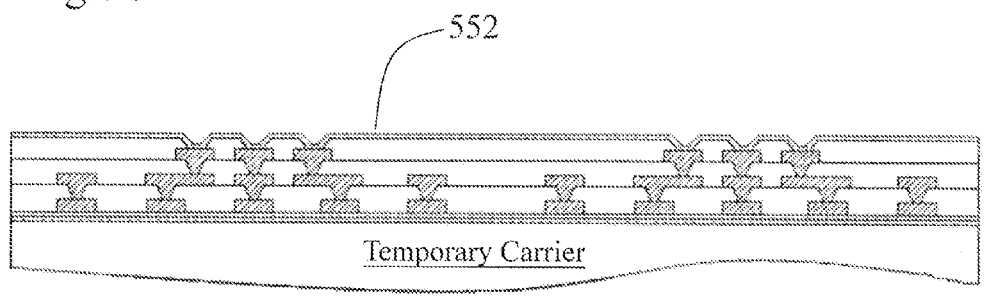
Figure 6H:
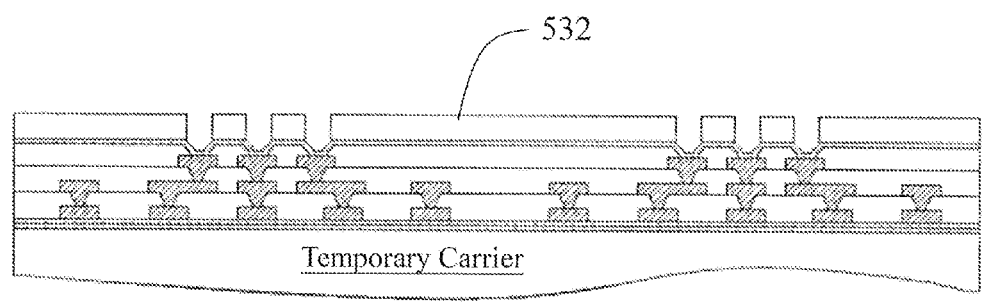
Figure 6I:
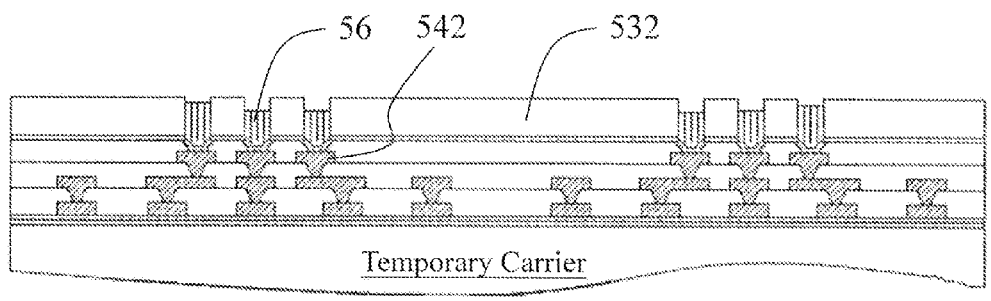
Figure 6J:
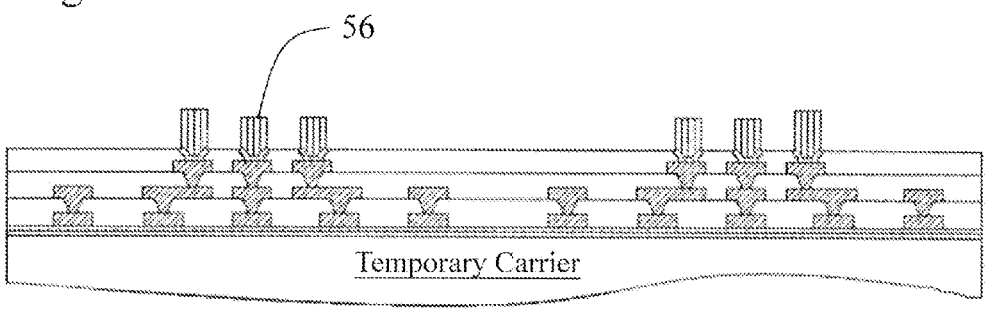
Figure 6K:
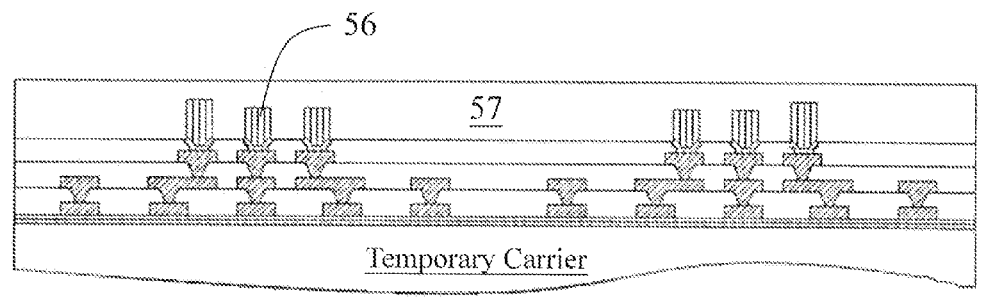
Figure 6L:
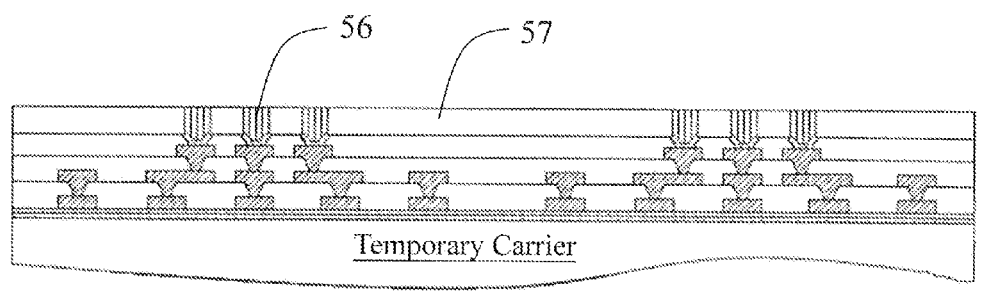
Figure 6M:
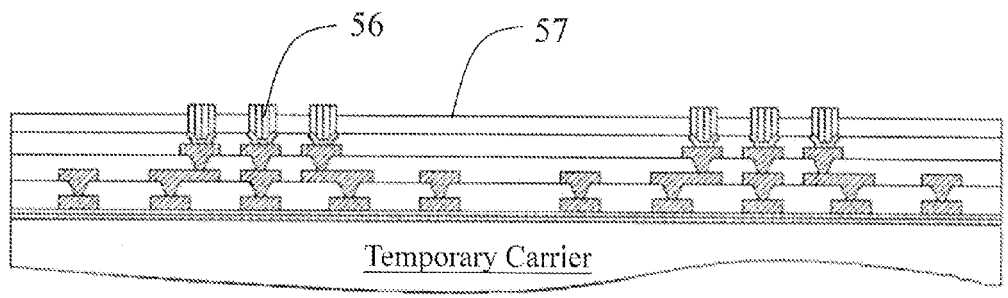
Figure 6N:
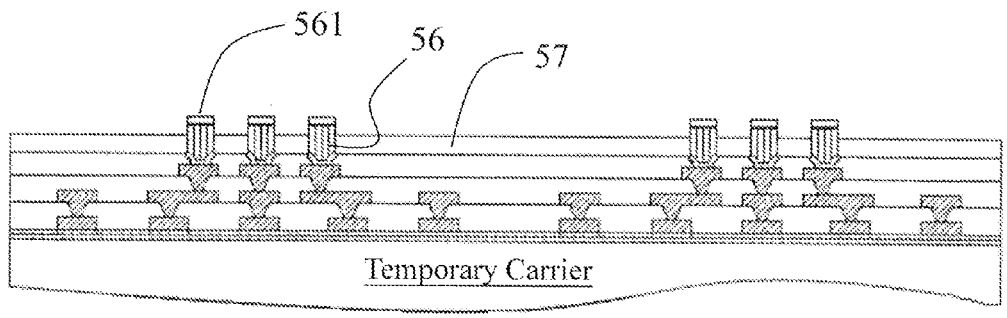
Figure 6O:
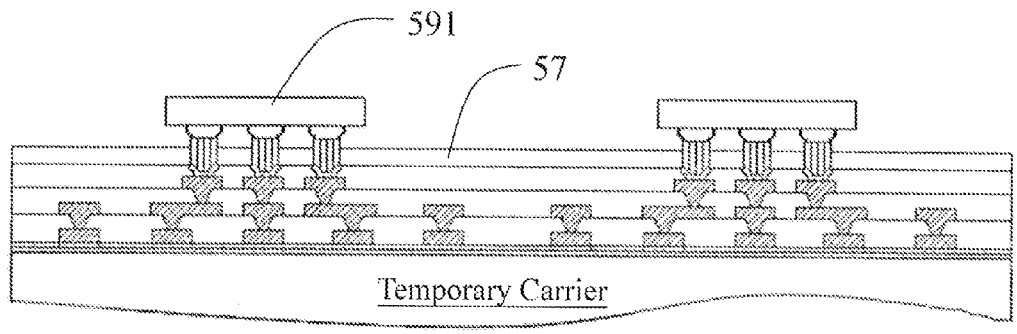
Figure 6P:
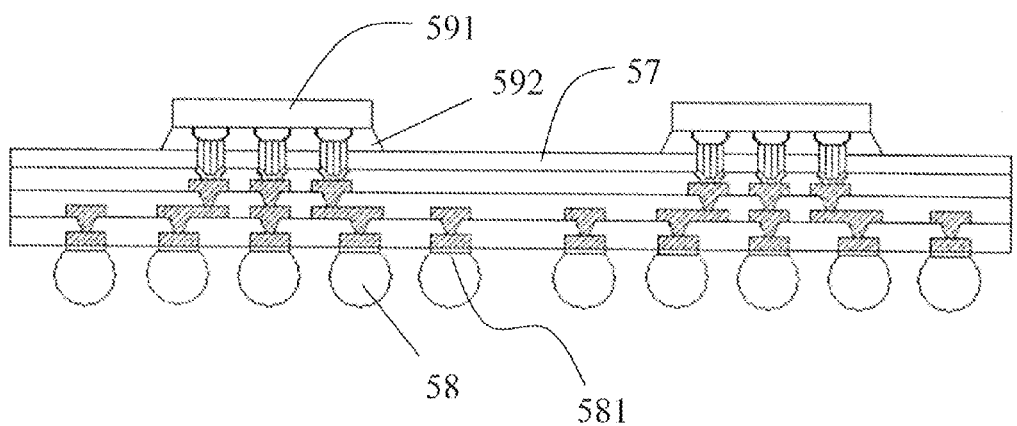
Figure 6Q:
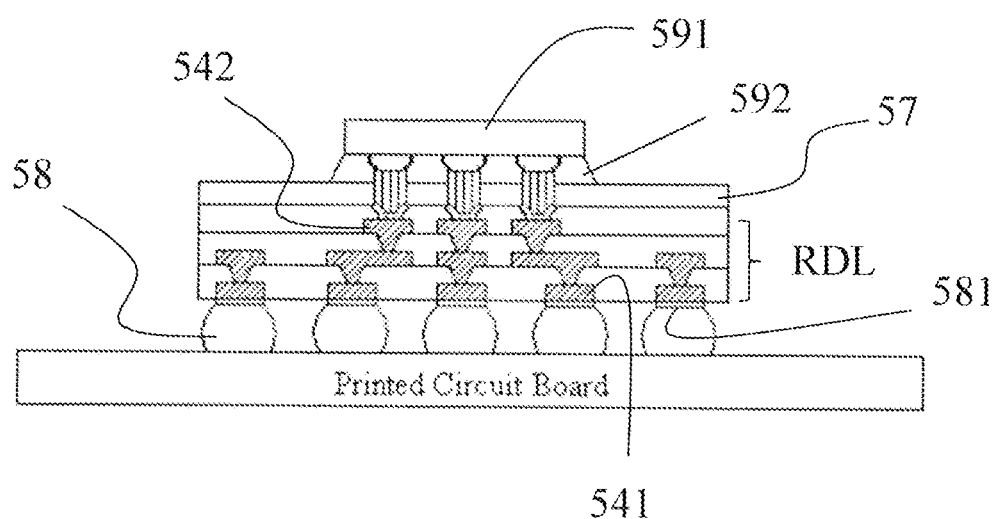

FIGS. 6A~6Q Shows a Seventh Embodiment According to the Present Invention.

FIG. 6A shows: preparing a temporary carrier; applying a release layer 51 on top of the temporary carrier;

FIG. 6B shows: applying a bottom seed layer 52 on top of the release layer 51;

FIG. 6C shows: applying a patterned photoresist 53 on top of the bottom seed layer 52;

FIG. 6D shows: forming a patterned bottom metal pad 541;

FIG. 6E shows: stripping the photoresist;

FIG. 6F shows: forming an RDL using the bottom metal pad 541 as a starting point; and with a plurality of top metal pad 542 formed on top of the RDL;

FIG. 6G shows: applying a top seed layer 552 on top of the RDL;

FIG. 6H shows: forming a patterned photoresist 532 on top of the top seed layer;

FIG. 6I shows: forming a plurality of metal pillar 56, each is formed on top of a corresponding top metal pad 542;

FIG. 6J shows: stripping the photoresist 532 and stripping the top seed layer 552 between metal pillars 56;

FIG. 6K shows: applying a molding compound 57 to encapsulate the plurality of metal pillar 56;

FIG. 6L shows: thinning from top of the molding compound 57 to reveal a top of each metal pillar 56.

FIG. 6M shows: removing portion of the molding compound 57 from top to expose a top end of each metal pillar 56; and FIG. 6N shows: applying solder paste 561 (e.g. Sn/Ag) on top of each metal pillar.

FIG. 6O shows: mounting an IC chip 591 on top of the plurality of metal pillar 56.

FIG. 6P shows: underfilling a space 592 between the IC chip 591 and the molding compound 57; removing the temporary carrier; removing the bottom seed layer 52; forming a protection layer 581 on bottom of each bottom metal pad 541; and planting a solder ball 58 on a bottom of a corresponding protection layer 581.

FIG. 6Q shows: singulating into a plurality of single package unit, and mounting on top of a printed circuit board.

While several embodiments have been described by way of example, it will be apparent to those skilled in the art that various modifications may be configured without departs from the spirit of the present invention. Such modifications are all within the scope of the present invention, as defined by the appended claims.

What is claimed is:

1. A thin film redistribution layer (RDL) structure for an integrated circuit (IC) package, the thin film RDL structure comprising:
   a redistribution layer having
      a plurality of top metal pads, and
      a plurality of bottom metal pads,
   wherein a density of the top metal pads is higher than a density of the bottom metal pads;
   a molding compound having
      opposite uppermost and lowermost surfaces, and
      a uniform thickness between the uppermost and lowermost surfaces; and
   a plurality of metal pillars, each configured on top of a corresponding top metal pad among the plurality of top metal pads,
   wherein
   the redistribution layer further comprises a topmost dielectric layer,
   the plurality of top metal pads and a bottom end of each metal pillar among the plurality of metal pillars are embedded in the topmost dielectric layer, and
   each metal pillar among the plurality of metal pillars has
      a middle portion embedded in the molding compound,
      a top end protruding upwardly above the uppermost surface of the molding compound, and
      the bottom end protruding downwardly below the lowermost surface of the molding compound.

2. A thin film RDL structure as claimed in claim 1, further comprising:
   a plurality of solder balls, each configured on bottom of a corresponding bottom pad among the plurality of bottom metal pads.

3. A thin film RDL structure as claimed in claim 1, further comprising:
   a bottom protection layer configured on bottom of a corresponding bottom metal pad among the plurality of bottom metal pads.

4. A thin film RDL structure as claimed in claim 3, wherein the bottom protection layer is selected from the group consisting of Electroless Nickel/Electroless Palladium/Immersion Gold (ENEPIG) and Organic Solderability Preservatives (OSP).

5. A thin film RDL structure as claimed in claim 3, further comprising:
   a plurality of solder balls, each configured on bottom of the bottom protection layer of a corresponding bottom metal pad among the plurality of bottom metal pads.

6. A thin film RDL structure as claimed in claim 5, wherein the bottom protection layer is selected from the group consisting of ENEPIG and OSP.

7. A thin film RDL structure as claimed in claim 1, wherein the bottom end of each metal pillar among the plurality of metal pillars is electrically coupled to a corresponding top metal pad among the plurality of top metal pads.

8. A thin film RDL structure as claimed in claim 7, further comprising:
   a bottom protection layer configured on bottom of a corresponding bottom metal pad among the plurality of bottom metal pads; and
   a plurality of solder balls, each configured on bottom of the bottom protection layer of a corresponding bottom metal pad among the plurality of bottom metal pads.

9. A thin film RDL structure as claimed in claim 8, wherein the bottom protection layer is selected from the group consisting of ENEPIG and OSP.

10. A thin film RDL structure as claimed in claim 9, further comprising:
    an under-filling material between the chip and the uppermost surface of the molding compound,
    wherein the top end of each metal pillar among the plurality of metal pillars is embedded in the under-filling material.

11. A thin film RDL structure as claimed in claim 1, further comprising:
- solder paste directly on the top ends of the plurality of metal pillars; and
- a chip directly on the solder paste.

12. A thin film RDL structure as claimed in claim 11, further comprising:
- an under-filling material between the chip and the uppermost surface of the molding compound,
- wherein the top end of each metal pillar among the plurality of metal pillars is embedded in the under-filling material.

13. A fabricating process for a thin film redistribution layer (RDL) structure for an integrated circuit (IC) package, the fabricating process comprising:
- applying a release layer on top of a temporary carrier;
- applying a bottom seed layer on top of the release layer;
- applying a first patterned photoresist on top of the bottom seed layer;
- forming a plurality of patterned bottom metal pads;
- stripping the first patterned photoresist;
- forming an RDL using the plurality of bottom metal pads as a starting point, the RDL having a plurality of top metal pads, wherein a density of the top metal pads is higher than a density of the bottom metal pads;
- applying a top seed layer on top of the RDL;
- forming a second patterned photoresist on top of the top seed layer;
- forming, in the second patterned photoresist, a plurality of metal pillars, each on top of a corresponding top metal pad among the plurality of top metal pads;
- stripping the second patterned photoresist and stripping the top seed layer between the plurality of metal pillars;
- applying a molding compound to encapsulate the plurality of metal pillars;
- thinning the molding compound from top to expose top surfaces of the plurality of metal pillars, so that the molding compound has
  - opposite uppermost and lowermost surfaces, and
  - a uniform thickness between the uppermost and lowermost surfaces;
- after said thinning, removing a portion of the molding compound from top to expose top ends of the plurality of metal pillars, wherein each metal pillar among the plurality of metal pillars has
  - a middle portion embedded in the molding compound,
  - the top end protruded upwardly above the uppermost surface of the molding compound and having the exposed top surface, and
  - a bottom end protruded downwardly below the lowermost surface of the molding compound; and
- mounting a chip on the top ends of the plurality of metal pillars.

14. A fabricating process for a thin film RDL structure as claimed in claim 13, further comprising:
- before said mounting the chip, applying solder paste on the exposed top ends of the plurality of metal pillars.

15. A fabricating process for a thin film RDL structure as claimed in claim 14, further comprising:
- underfilling a space between the chip and the uppermost surface of the molding compound.

16. A fabricating process for a thin film RDL structure as claimed in claim 15, further comprising:
- removing the temporary carrier; and
- removing the bottom seed layer.

17. A fabricating process for a thin film RDL structure as claimed in claim 16, further comprising:
- forming a protection layer on bottom of each bottom metal pad among the plurality of bottom metal pads; and
- planting a plurality of solder balls, each on bottom of the protection layer of a corresponding bottom metal pad among the plurality of bottom metal pads.

* * * * *